United States Patent [19]

Doi et al.

[11] Patent Number: 4,827,489

[45] Date of Patent: May 2, 1989

[54] DECODING DEVICE FOR DIGITAL SIGNALS

[75] Inventors: Nobukazu Doi, Hachioji; Hideki Imai, Yokohama; Morishi Izumita, Inagi; Seiichi Mita, Kanagawa; Akira Saito, Katsuta; Hiroto Yamauchi, Kokubunji; Mamoru Kaneko; Tetsuya Amano, both of Hachioji, all of Japan

[73] Assignees: Hitachi, Ltd., Tokyo; Hitachi Video Engineering, Incorporated, Kanagawa, both of Japan

[21] Appl. No.: 44,489

[22] Filed: May 1, 1987

[30] Foreign Application Priority Data

May 2, 1986 [JP] Japan .................................. 61-100995

[51] Int. Cl.$^4$ .............................................. H04L 27/06
[52] U.S. Cl. ........................................ 375/94; 375/76; 371/41
[58] Field of Search .................... 375/76, 94; 307/356, 307/357, 358, 359; 371/41, 48, 43, 47

[56] References Cited

U.S. PATENT DOCUMENTS 3,908,169  9/1975  Tong ...................................... 375/76
4,535,294  8/1985  Ericksen et al. ...................... 375/76
4,700,357  10/1987  Ast ........................................ 375/76
4,700,365  10/1987  Casey .................................. 307/359

FOREIGN PATENT DOCUMENTS 51-40782  3/1976  Japan .
58-90853  5/1983  Japan .
60-2812   1/1985  Japan .

OTHER PUBLICATIONS

Peterson "Error Correction Codes", MIT Press.

*Primary Examiner*—Robert L. Griffin
*Assistant Examiner*—Stephen Chin
*Attorney, Agent, or Firm*—Antonelli, Terry & Wands

[57] ABSTRACT

A device for decoding coded digital signals for every symbol consisting of a plurality of binary signals comprises first circuit for generating a first reliability for every binary signal; hard decided from the received or reproduced signal, in the symbol and second circuit for generating a second reliability for every symbol consisting of n binary signals on the basis of the first reliability, whereby decoding processing e.g. soft decision decoding is effected for every signal, depending on the second reliability.

7 Claims, 8 Drawing Sheets

FIG. 2
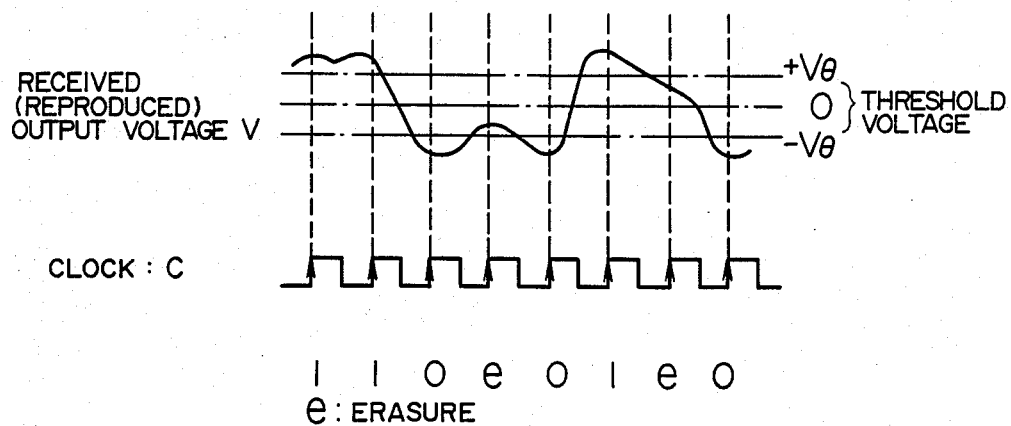
FIG. 3A
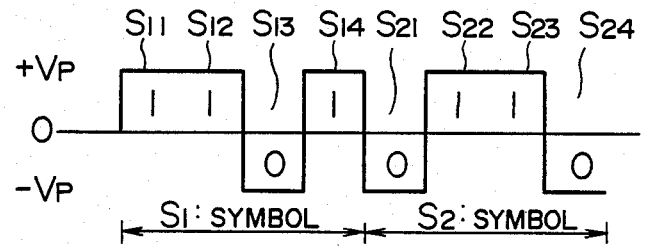
FIG. 3B
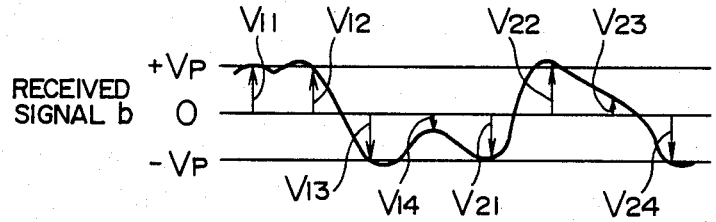
FIG. 3C
FIG. 3D
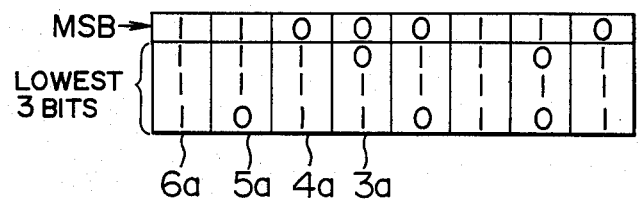

FIG. 5

| REPRODUCED SIGNAL (V) | MSB | RELIABILITY | | |
|---|---|---|---|---|
| NOT LESS THAN 1.0VP | 1 | 1 | 1 | 1 |
| $\frac{6}{7}$VP ~ 1.0VP | 1 | 1 | 1 | 0 |
| $\frac{5}{7}$VP ~ $\frac{6}{7}$VP | 1 | 1 | 0 | 1 |
| $\frac{4}{7}$VP ~ $\frac{5}{7}$VP | 1 | 1 | 0 | 0 |
| $\frac{3}{7}$VP ~ $\frac{4}{7}$VP | 1 | 0 | 1 | 1 |
| $\frac{2}{7}$VP ~ $\frac{3}{7}$VP | 1 | 0 | 1 | 0 |
| $\frac{1}{7}$VP ~ $\frac{2}{7}$VP | 1 | 0 | 0 | 1 |
| 0.0VP ~ $\frac{1}{7}$VP | 1 | 0 | 0 | 0 |
| $-\frac{1}{7}$VP ~ 0.0VP | 0 | 0 | 0 | 0 |
| $-\frac{2}{7}$VP ~ $-\frac{1}{7}$VP | 0 | 0 | 0 | 1 |
| $-\frac{3}{7}$VP ~ $-\frac{2}{7}$VP | 0 | 0 | 1 | 0 |
| $-\frac{4}{7}$VP ~ $-\frac{3}{7}$VP | 0 | 0 | 1 | 1 |
| $-\frac{5}{7}$VP ~ $-\frac{4}{7}$VP | 0 | 1 | 0 | 0 |
| $-\frac{6}{7}$VP ~ $-\frac{5}{7}$VP | 0 | 1 | 0 | 1 |
| $-1.0$VP ~ $-\frac{6}{7}$VP | 0 | 1 | 1 | 0 |
| LESS THAN $-1.0$VP | 0 | 1 | 1 | 1 |

3b  3a

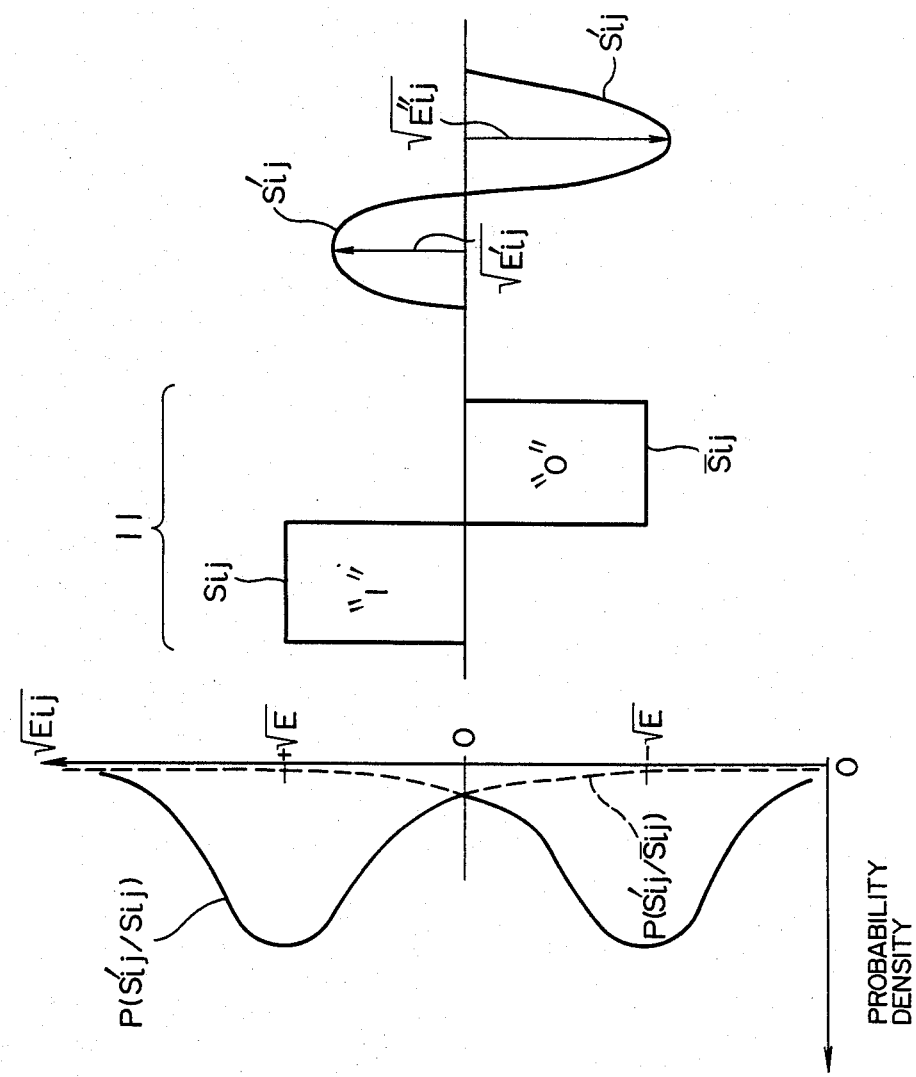

F I G. 8

| SN RATIO (SYMBOL ERROR RATE) | $\overline{P(\hat{S}_{ij}/\overline{S_{ij}})} / \overline{P(\hat{S}_{ij}/S_{ij})}$ |
|---|---|
| 0 dB ($6.3 \times 10^{-1}$) | $1.8 \times 10^{-2}$ |
| 2 dB ($2.6 \times 10^{-1}$) | $1.8 \times 10^{-3}$ |
| 4 dB ($1.0 \times 10^{-1}$) | $4.3 \times 10^{-5}$ |
| 6 dB ($1.9 \times 10^{-2}$) | $1.2 \times 10^{-7}$ |
| 8 dB ($1.5 \times 10^{-3}$) | $1.1 \times 10^{-11}$ |
| 10 dB ($3.1 \times 10^{-5}$) | — |

DECODING DEVICE FOR DIGITAL SIGNALS

BACKGROUND OF THE INVENTION

This invention relates to a decoding device for generating digital signals and reliability of the digital signals from reproduced signals or received signals of coded digital signals and in particular to a decoding device for generating reliability from said reproduced signals or received signals of coded digital signals for every symbol consisting of a plurality (n) of binary signals.

In a usual digital system, digital signals are transmitted or recorded with parity signals for error correction. Errors which have occured at the transmission (sending/receiving) or at the recording/reproduction are corrected on the basis of the parity signals and thereafter the original digital signals are restored.

The hard decision decoding and the soft decision decoding are known as the error correcting method.

By the hard decision decoding a signal is made to correspond to a binary signal, "0" or "1", depending on whether the output voltage of the received (reproduced) signal is higher or lower than a predetermined reference voltage. For the binary signal of a digital system thus obtained, the errors are corrected on the basis of the parity signals for error correction and decoded to the original one. This method is widely utilized in compact disc players and others, because the decoding device can be easily constructed.

On the other hand, by the soft decision decoding, e.g. as indicated in FIG. 2, when the received (reproduced) output voltage V synchronized with the clock signal c is higher than $+V_\theta$, the output signal is "1"; when it is lower than $-V_\theta$, the output signal is "0"; and when it is comprised between $+V_\theta$ and $-V_\theta$, the output signal is "e" (erased). This method is disclosed e.g. in JP-A-58-90853. Further, in JP-B-60-2812 is disclosed a soft decision decoding device for detecting errors, in which, only when the error position is in accordance with the erasure "e" stated above, the error is corrected and when the error position is not in accordance therewith, it is thought that an error, which is beyond the correcting capacity, is produced. The known soft decision decoding device described above is one of the simplest examples and in general the soft decision decoding is one, by which a binary signal and a reliability representing the likelihood of the value of the binary signal are obtained and the errors in the digital signal are corrected by using both this reliability and parity signals for error correction. For this reason the latent capacity, which the error correction code has, can be amply brought out and the signal-noise ratio (SN ratio) can be increased by about 2-3 dB with respect to that of the hard decision decoding.

The prior art techniques relate to a decoding device for generating a digital signal and its reliability for every digital signal from the reproduced or received signal and nothing is disclosed to generate the reliability for every symbol consisting of a plurality (n) of digital signals of coded digital signals of $2^n$- ary codes. For this reason it was not possible to apply the soft decision decoding for $2^n$- ary codes, for which errors are corrected for every symbol, such as e.g. codes over $GF(2^n)$. $GF(2^n)$ means Galois Field, having $2^n$ elements.

SUMMARY OF THE INVENTION

The object of this invention is to provide a decoding device for generating digital signals and their reliability for every symbol from reproduced or received signals, which enables the soft decision decoding of $2^n$- ary codes.

The object stated above can be achieved by generating the reliability of a symbol from the reliability of each of the digital signals constituting the symbol.

A symbol is erroneous, if even one digital signal among the n digital signals constituting it is erroneous. That is, since the reliability of a symbol depends on the reliability of each of the digital signals constituting it, it is possible to generate the reliability, which is the most suitable as the reliability of the symbol, by utilizing the reliability of each of the digital signals.

BRIEF DESCRIPTION OF THE DRAWINGS

FIG. 2 is a scheme for explaining the prior art techniques;

FIGS. 3A to 3D shows schemes for explaining the working mode of this invention;

FIG. 5 is a scheme for explaining the working mode of the A/D converter indicated in FIG. 4;

FIG. 7 shows schemes for explaining the embodiment indicatad in FIG. 1;

FIG. 8 is a scheme showing the relation between the SN ratio and the likelihood ratio.

DESCRIPTION OF THE PREFERRED EMBODIMENTS

Figure 1:
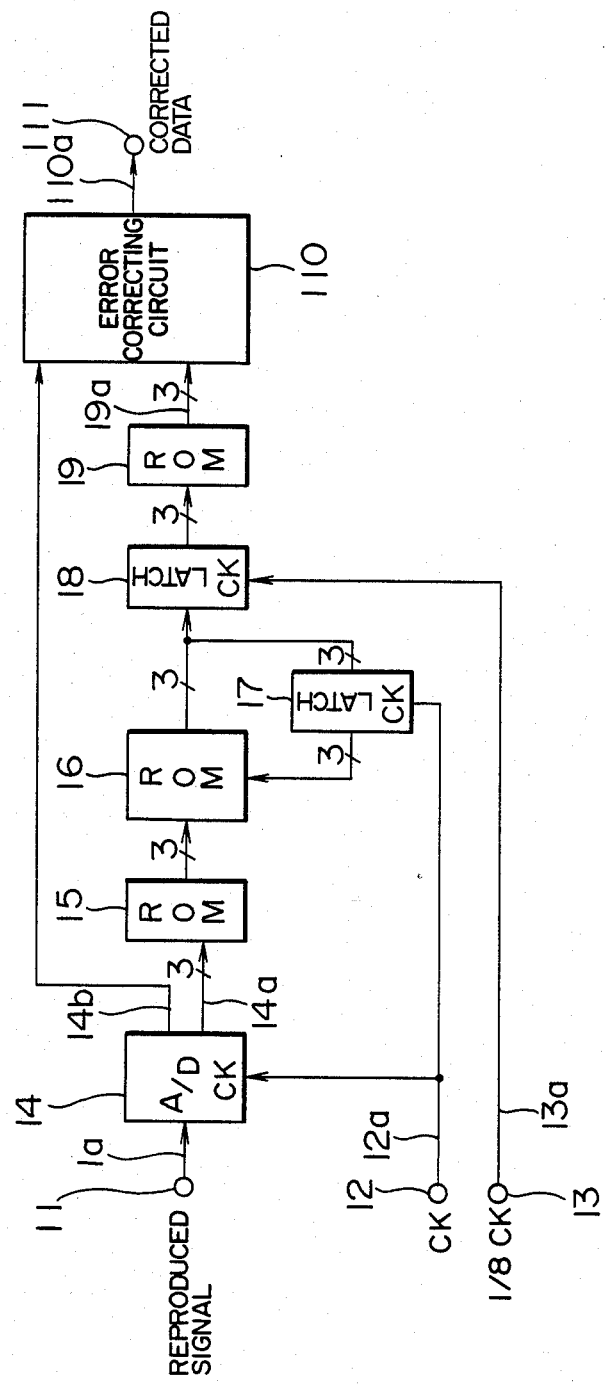
FIG. 1 is a block diagram illustrating an embodiment of this invention.

Hereinbelow some embodiments of this invention will be explained, referring to the drawings.

FIG. 3A shows two symbols which are a part of $2^4$-ary codes. The symbols $S_1$ and $S_2$ consist of four binary signals $S_{11}, S_{12}, S_{13}, S_{14}$ and $S_{21}, S_{22}, S_{23}, S_{24}$, respectively. Errors in the $2^4$ - ary codes are corrected for every symbol. According to the prior art techniques indicated in FIG. 2, the reliability (erasure "e") representing the likelihood is generated for every digital (binary) signal and errors in the binary signals are corrected by using the reliability thus obtained. On the contrary, for the $2^4$- ary codes, the reliability should be generated for every symbol. This invention provides a decoding device, in which the reliability of each of the binary signals $S_{11}, S_{12}, \ldots, S_{23}, S_{24}$ constituting the symbols $S_1$ and $S_2$ is obtained and the reliability of each of the symbols is generated on the basis thereof.

The following three methods are conceivable for generating the reliability of the symbols.

(1) The reliability of the binary signal having the lowest reliability among those of the binary signals constituting a symbol is adopted as the reliability of the symbol. In FIG. 3, supposing that the reliability of the binary signals are analogue amplitudes $V_{11}, V_{12}, V_{13}$ and $V_{14}$ measured from the reference level 0 of the received (reproduced) signal b (FIG. 3B) in synchronism with the sampling clock c (FIG. 3C), the reliability of the symbol $S_1$ is the reliability $V_{14}$ of the binary signal $S_{14}$ having the lowest reliability (amplitude). In the same way the reliability of the symbol $S_2$ is the reliability $V_{23}$ of the binary signal $S_{23}$.

(2) The product of the reliabilities of the binary signals constituting a symbol is adopted as the reliability of the symbol.

In this case the reliability of the symbol $S_1$ is represented by $V_{11} \cdot V_{12} \cdot V_{13} \cdot V_{14}$, which is the product of the reliabilities $V_{11}$, $V_{12}$, $V_{13}$ and $V_{14}$ of the binary signals. In the same way the reliability of the symbol $S_2$ is represented by $V_{21} \cdot V_{22} \cdot V_{23} \cdot V_{24}$.

(3) The sum of the reliabilities of the binary signals constituting a symbol is adopted as the reliability of the symbol.

In this case the reliability of the symbol $S_1$ is represented by $V_{11} + V_{12} + V_{13} + V_{14}$, which is the sum of the reliabilities $V_{11}$, $V_{12}$, $V_{13}$ and $V_{14}$ of the binary signals. In the same way the reliability of the symbol $S_2$ is represented by $V_{21} + V_{22} + V_{23} + V_{24}$.

Figure 4:
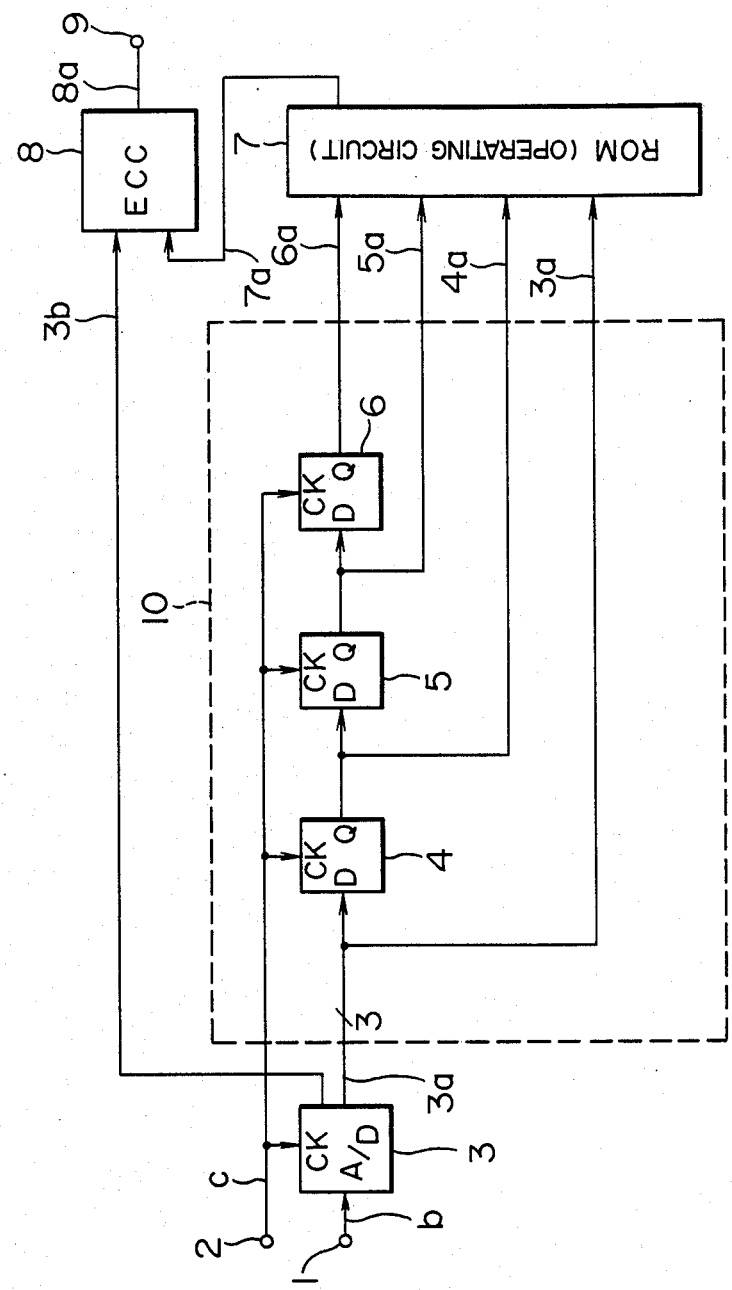
FIG. 4 is a block diagram illustrating another embodiment of this invention.

FIG. 4 illustrates a first embodiment for realizing the methods (1), (2) and (3) described above. An A/D converter 3 transforms the received (reproduced) signal b into a digital signal quantized e.g. in 4 bits. The MSB (Most Significant Bit) 3b of this quantized digital signal is inputted in an error correcting circuit 8. The lowest 3 bits 3a except for the MSB of the quantized digital signal are inputted in a shift register 10 consisting of latch circuits 4, 5 and 6. The A/D converter 3, and the latch circuits 4, 5 and 6 work in synchronism with the clock c. A ROM 7 receives the lowest 3 bits 3a from the A/D converter 3 and the lowest 3 bits 4a, 5a and 6a from the latch circuits 4, 5 and 6, respectively, effects a predetermined transformation and outputs the result of the transformation, i.e. the reliability of the symbol 7a to the error correcting circuit 8. The error correcting circuit 8 corrects the errors in the MSB 3b on the basis of the MSB 3b and the reliability of the symbol 7a and outputs corrected data from an output terminal 9.

Hereinbelow the working mode of this embodiment will be explained in detail, referring to FIGS. 3 and 5.

The A/D converter 3 transforms each of the amplitudes $V_{11}$, $V_{12}$, $V_{13}$ and $V_{14}$ of the received (reproduced) signal b inputted from the input terminal 1 into a 4-bit digital signal, whose reference level is 0. FIG. 5 shows this transformation table. That is, when the amplitude of the reproduced signal is greater than the voltage $V_p$ at the sending (recording), the reliability of the reproduced signal is "111". The MSB among the 4 bits is "138", when the amplitude of the reproduced signal is positive with respect to the reference of 0, and "0", when it is negative. The 4-bit digital signal thus obtained is shown in FIG. 3D. The MSB 3b represents a binary signal for the received signal, and is taken in the error correcting circuit 8. The lowest 3 bits are taken in the latch circuits, within the shift register 10. At this time the lowest 3 bits represent the reliability of the binary signal. The ROM 7 takes-in the reliabilities 3a, 4a, 5a and 6a corresponding to the binary signals, in this case 4-bit binary signals, respectively, constituting the symbol and outputs the lowest reliability among them according to the method (1), the product of 3a, 4a, 5a and 6a according to the method (2) and the sum of 3a, 4a, 5a and 6a according to the method (3) to the error correcting circuit 8. The error correcting circuit 8 corrects the errors contained in the binary signal 3b by utilizing the binary signal 3b and the reliability 7a of the symbol and outputs corrected data 8a from the output terminal 9. As an error correcting method utilizing the reliability of the symbol described above (soft decision decoding) there is known an erasure correction, by which errors are corrected, supposing that an appropriate number of symbols having low symbol reliabilities among error correction codes indicate erroneous positions. The erasure correction has an error correction capacity, which is at the most two times as great as that of the hard decision decoding. The erasure correction is described in detail e.g. "Error-Correcting Codes, Second Edition" by Peterson and Weldon. Literature (1), MIT Press (1972), p. 305 –p. 307.

Figure 6C:
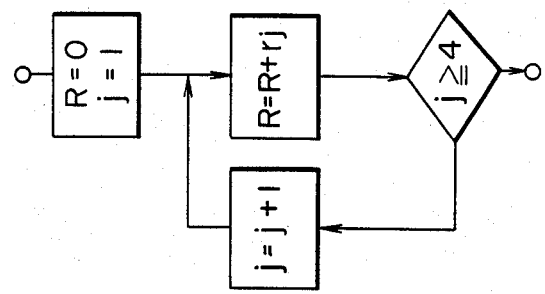
FIGS. 6A, 6B and 6C are flow charts, in the case where the read only memory (hereinbelow abbreviated to ROM) is realized by a microcomputer.
Figure 6B:
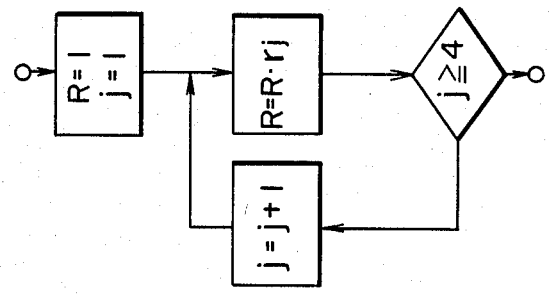
Figure 6A:
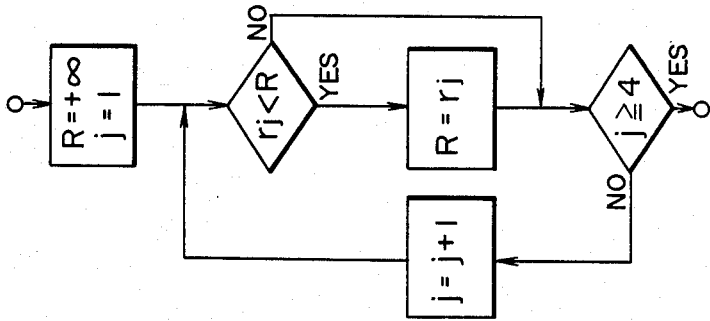

FIGS. 6A, 6B and 6C show processing steps (flow chart), in the case where the generation of the reliability for every symbol is effected by logic operation by means of a microcomputer, etc. instead of the ROM 7. FIG. 6A shows a flow chart, in the case where the reliability of the binary signal having the lowest reliability is adopted as the reliability of the symbol; FIG. 6B is a flow chart, in the case where the product of the reliabilities of the binary signals constituting a symbol is adopted as the reliability of the symbol; and FIG. 6C is a flow chart, in the case where the sum of the reliabilities of the binary signals constituting a symbol is adopted as the reliability of the symbol.

The processing steps of the symbol reliability generating method shown in FIG. 6A will be explained below. It is supposed as the initial setting that the reliability R of the symbol is sufficiently large and that a variable j is 1. Then, when the reliability $r_j$ of the j-th binary signal within the symbol is smaller than R, the value of R is replaced by $r_j$ and when $r_j$ is greater than R, the value of R is kept as it is. In the case where j is smaller than 4, $j = j + 1$ and the processing described above is repeated and when j is equal or greater than 4, R is outputted as the reliability of the symbol.

Next, the processing steps of the symbol reliability generating method shown in FIG. 6B will be explained. As the initial setting, the reliability R of the symbol is set to 1 and the variable j to 1. Then R is replaced by the product of the reliability $r_j$ of the j-th binary signal within the symbol by R. In the case where j is smaller than 4, $j = j + 1$ and the processing described above is repeated and when j is equal to or greater than 4, R is outputted as the reliability of the symbol.

Finally, the processing steps of the symbol reliability generating method showing in FIG. 6C will be explained. As the initial setting, the reliability R of the symbol is set to 0 and the variable j to 1. Then R is replaced by the sum of the reliability $r_j$ of the j-th binary signal within the symbol and R. In the case where j is smaller than 4, $j = j\ 30\ 1$ and the processing described above is repeated and when j is equal or greater than 4, R is outputted as the reliability of the symbol.

According to the embodiment described above it is possible to generate the reliability for the received or reproduced signals for every symbol and even in the case where error correction is effected for every symbol as for $2^n$ - ary codes, soft decision decoding is possible.

Next, a second embodiment, which is suitable for generating the reliability of a symbol, will be explained.

FIG. 7 is a scheme for explaining the principle of the second embodiment. The reference numeral 11 is a binary digital signal having an amplitude $\pm \sqrt{E}$, which corresponds to a in FIG. 3. An amplitude $+\sqrt{E}\ (S_{ij})$ corresponds to a code "1" and an amplitude $-\sqrt{E}\ (S_{ij})$ corresponds to a code "0". $S'_{ij}$ is a received (reproduced signal) of the digital signal 11 and corresponds to b in FIG. 3B. It is supposed that the received signal $S'_{ij}$ includes white Gaussian noise having a single-sided noise power density of No/2, which is produced in the channel. At this time, P $(S'_{ij}/S_{ij})$ represents a conditional probability density, in the case where a received signal $S'_{ij}$ influenced by noise and having an amplitude $\sqrt{E'}_{ij}$ or $\sqrt{E''}_{ij}$ is received, when a binary signal obtained by hard decision of $S'_{ij}$, whose amplitude is $+\sqrt{E}$ ("1") when $S'_{ij}$ is positive and $-\sqrt{E}$ ("0") when $S'_{ij}$ is negative, is transmitted. P $(S'_{ij}/\overline{S}_{ij})$ represents a conditional probability density, in the case where a received signal $S'_{ij}$ having an amplitude $\sqrt{E'}_{ij}$ or $\sqrt{E''}_{ij}$ is received, when the inverse of the binary signal obtained by hard decision of $S'_{ij}$, i.e. a signal, whose amplitude is $-\sqrt{E}$("0") when $S'_{ij}$ is positive and $+\sqrt{E}$("1") when $S'_{ij}$ is negative, is transmitted. These P $(S'_{ij}/S_{ij})$ and P $(S'_{ij}/\overline{S}_{ij})$ can be expressed as follows:

$$P(S'_{ij}/S_{ij}) = (\pi No)^{-\frac{1}{2}} \exp\{-(|S'_{ij}| - \sqrt{E})^2/No\} \quad (1)$$

$$P(S'_{ij}/\overline{S}_{ij}) = (\pi No)^{-\frac{1}{2}} \exp\{-(|S'_{ij}| - (\Delta\sqrt{E}))^2/No\}$$

The logarithm of the probability ratio P $(S'_{ij}/S_{ij})/P(S'_{ij}/\overline{S}_{ij})$ of the received binary signal in this case, i.e.

$$r_{ij} = \log\{P(S'_{ij}/S_{ij})/P(S'_{ij}/\overline{S}_{ij})\} \quad (2)$$
$$= \frac{4S'_{ij}\sqrt{E}}{No}$$

represents the reliability of the binary signal.

Here a case where this idea is applied to $2^n$-ary codes is considered. Now suppose that the i-th received symbol be $S'_i=(S'_{i1}, S'_{i2}, S'_{i3}, \ldots, S'_{in})$ and that the result obtained by hard decision of this received symbol be $S_i=(S_{i1}, S_{i2}, S_{i3}, \ldots, S_{in})$. The reliability $L_1$ of the symbol at this time can be obtained by writing $P(S'_{ij}/S_{ij})$ and $P(S'_{ij}/\overline{S}_{ij})$ in Eq. (2) as follows:

$$L_1 = \log\{P(S'_i/S_i)/\Sigma P(S'_i/\overline{S}_i)\} \quad (3)$$

The i of $S'_i$ and that of $\overline{S}_i$ in $\Sigma P(S'_i/\overline{S}_i)$ are not same.

$$P(S'_i/S_i) = P(S'_{i1}/S_{i1})P(S'_{i2}/S_{i2}) \ldots P(S'_{in}/S_{in}) \quad (4)$$

$$\Sigma P(S'_i/S_i) = \{P(S'_{i1}/\overline{S_{i1}})P(S'_{i2}/S_{i2}) \ldots P(S'_{in}/S_{in}) + \quad (5)$$
$$P(S'_{i1}/S_{i1})P(S'_{i2}/\overline{S_{i2}}) \ldots P(S'_{in}/S_{in}) + \ldots +$$
$$P(S'_{i1}/S_{i1})P(S'_{i2}/Si2) \ldots P(S'in/\overline{S}_{in})\} +$$
$$\{P(S'_{i1}/\overline{S_{i1}})P(S'_{i2}/\overline{S_{i2}})P(S_{i2})P(S'_{i3}/\overline{S}_{i3}) \ldots$$
$$P(S'_{in}/S_{in}) +$$
$$P(S'_{i1}/S_{i1})P(S'_{i2}/\overline{S}_{i2})P(S'_{i3}/\overline{S}_{i3}) \ldots$$
$$P(S'_{in}/S_{in}) + \ldots +$$
$$P(S'_{i1}/S_{i1})P(S'_{i2}/S_{i2}) \ldots P(S'_{in-1}/\overline{S}_{in-1})$$
$$P(S'_{in}\overline{S}_{in})\} +$$
$$\{P(S'_{i1}/\overline{S_{i1}})P(S'_{i2}/\overline{S_{i2}})P(S'_{i3}/\overline{S}_{i3}) \ldots$$
$$P(S'_{in}/S_{in}) + \ldots +$$
$$P(S'_{i1}/S_{i1}) \ldots P(S'_{in-2}/\overline{S}_{in-2})P(S'_{in-1}/\overline{S}_{in-1})$$
$$P(S'_{in}/\overline{S}_{in})\} + \ldots +$$

$$P(S'_{i1}/\overline{S}_{i1})P(S'_{i2}/\overline{S}_{i2})P(S'_{i3}/\overline{S}_{i3}) \ldots$$

$$P(S'_{in}/\overline{S}_{in})$$

In general, $P(S'_{ij}/S_{ij}) > P(S'_{ij}/\overline{S}_{ij})$. However, if the SN ratio is sufficiently large, as indicated in FIG. 8, $\overline{P(S'_{ij}/S_{ij})} >> \overline{P(S'_{ij}/\overline{S}_{ij})}$, where $\overline{P(S'/S)}$ represents the average of $P(S'/S)$. Consequently, if the SN ratio is sufficiently large, the 2nd order term and the followings of $P(S'_{ij}/\overline{S}_{ij})$ in Eq. (5) can be neglected and thus Eq. (5) can be approximated as follows:

$$L_1 \simeq \log[P(S'_{i1}/S_{i1})P(S'_{i2}/S_{i2}) \ldots P(S'_{in}/S_{in})/ \quad (6)$$
$$\{P(S'_{i1}/\overline{S_{i1}})P(S'_{i2}/S_{i2}) \ldots P(S'_{in}/S_{in}) +$$
$$P(S'_{i1}/S_{i1})P(S'_{i2}/\overline{S}_{i2}) \ldots P(S'_{in}/S_{in}) + \ldots +$$
$$P(S'_{i1}/S_{i1})P(S'_{i2}/S_{i2}) \ldots P(S'_{in}/\overline{S}_{in})\}]$$
$$= -\log\{P(S'_{i1}/\overline{S_{i1}})/P(S'_{i1}/S_{i1}) +$$
$$P(S'_{i2}/\overline{S}_{i2})/P(S'_{i2}/S_{i2}) + \ldots +$$
$$P(S'_{in}/\overline{S}_{in})P(S'_{in}/S_{in})\}$$

In Eq. (6) $P(S'_{ij}/\overline{S}_{ij})/P(S'_{ij}/S_{ij})$ is the inverse of the likelihood ratio of the j-th received binary signal and by using Eq. (1), it can be expressed as follows:

$$P(S'_{ij}/\overline{S}_{ij})/P(S'_{ij}/S_{ij}) = \exp(-4|S'_{ij}|\sqrt{E}/No). \quad (7)$$

Therefore the reliability $L_i$ of the i-th symbol can be expressed as follows:

$$L_i \simeq -\log\{\exp(-4|S'_{i1}|\sqrt{E}/No) + \quad (8)$$
$$\exp(-4|S'_{i2}|\sqrt{E}/No) + \ldots + \exp(-|4S'_{in}|\sqrt{E}/No)$$

By using the logarithmic likelihood ratio $r_{ij}$ of the received binary signal represented by Eq. (2), Eq. (8) can be expressed as follows:

$$L_i \simeq -\log\{\exp(-r_{i1}) + \exp(-r_{i2}) + \ldots + \exp(-r_{in})\}.$$

Now an embodiment giving the reliability $L_1$ of the symbol according to Eq. (8) is explained, referring to FIG. 1.

FIG. 1 shows a circuit for generating the reliability of the symbol in the case where the symbol is constructed by 4 binary signals. The reference numeral 14 is an A/D converter, for which the number of quantized bits is 4; 15, 16 and 19 are ROMs; 17 and 18 are latches; and 110 is an error correcting circuit.

The working mode of this embodiment will be explained below. A received (reproduced) signal 1a inputted to an input terminal 11 is transformed by the A/D converter into a quantized digital signal in synchronism with a clock 12a inputted to an input terminal 12. In the quantized digital signal described above, the MSB (Most Significant Bit) 14b gives a binary signal of "1" or "0" and the remaining 3 bits 14a excepting the MSB gives $S'_{ij}$ in Eq.(7). The ROM 15 transforms $S'_{ij}$ 14a into the likelihood ratio for every binary signal by using Eq. (7). The ROM 16 gives the sum of the output of the latch 17 and the output of the ROM 15 and the latch 17 receives it again in synchronism with the clock 12a. After the operation stated above has been repeated 4 times, the latch 18 receives it in synchronism with the clock 13a inputted from the input terminal 13, whose frequency is ¼ of that of the clock 12a. The signal taken-in by the latch 18 gives the value in { } of Eq. (8). The ROM 19 transforms the output of the latch 18 into the reliability 19a for every symbol by using Eq. (8) and outputs the result thus obtained to the error correcting circuit 110. The error correcting circuit 110 effects the soft decision decoding on the basis of the digital signal 14b and the reliability 19a for every symbol and outputs error-corrected data 110a from the output terminal 111. The soft decision decoding stated above is described in detail in the literature 1 stated previously.

Now, since all the terms contained in Eq. (8) are of the exponential type, terms having small $|S'_{ij}|$ are predominant in Eq. (8) and the reliability given by this embodiment can be approximated as follows:

$$L_1 \simeq -\log\{\exp(-4S'_{min}\sqrt{E}/No)\} \quad (9)$$
$$= 4S'_{min}\sqrt{E}/No$$

$$S'_{min} = \min(|S'_1|, |S'_2|, \ldots, |S'_n|) \quad (10)$$

Eqs. (9) and (10) can be expressed as follows by using the logarithmic likelihood ratio $r_{ij}$ of the received binary signal given by Eq. (2);

$$L_i \simeq \min(r_{i1}, r_{i2}, \ldots, r_{in}).$$

This is in accordance with the method (1) of the first embodiment.

Now an embodiment giving the reliability of the symbol will be explained by using Eqs. (9) and (10). In this embodiment the data transformation rule of the ROM 16 in FIG. 1 is changed to another one, by which the output of the ROM 15 is compared with the output of the latch 17 and that the smaller one is outputted. The other operations are identical to those described above.

Figure 9:
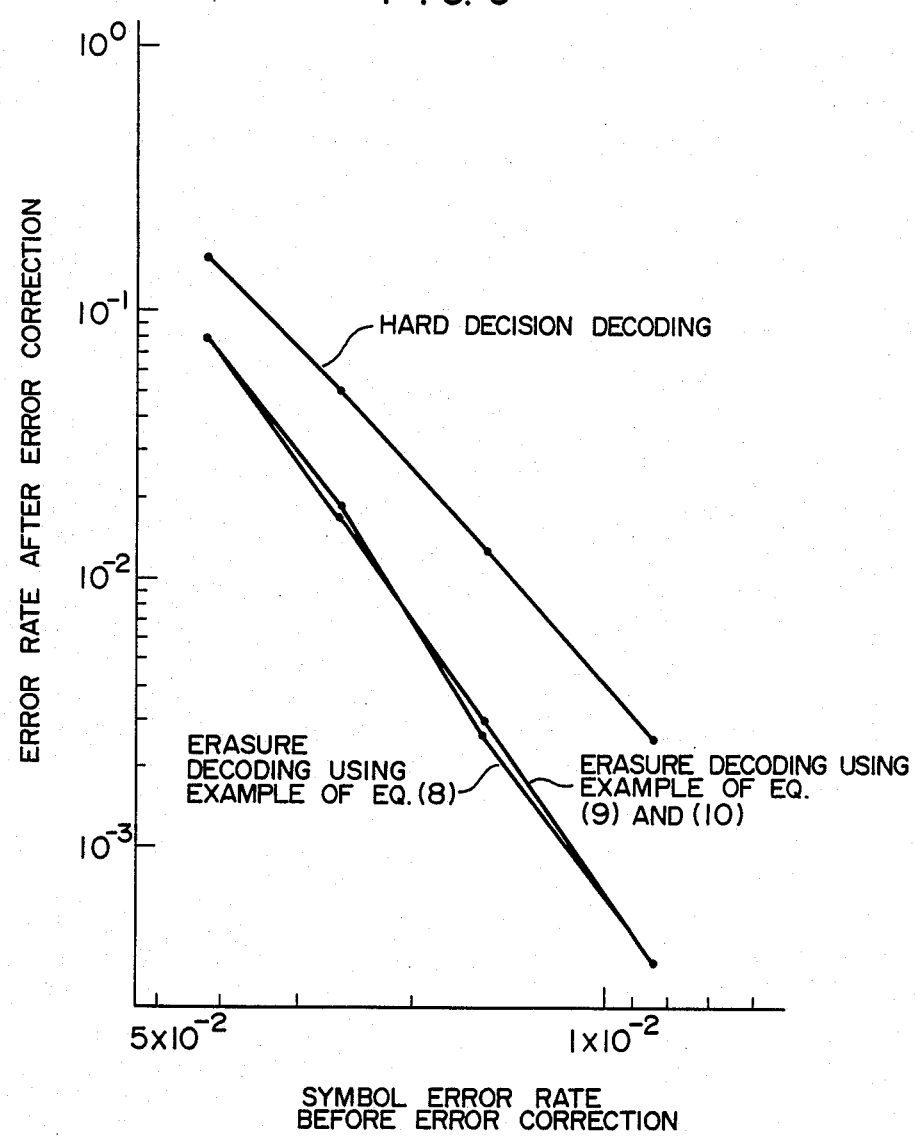
FIG. 9 a graph for explaining the correcting capacity of the embodiment indicated in FIG. 1 according to this invention and that of the prior art techniques, comparing them.

FIG. 9 indicates decoding characteristics obtained by a computer simulation, in the case where for Reed-solomon Codes (nonbinary error correcting codes adopted for the CD player), for which a symbol in constructed by 8 binary signal (n=8); the code length is 32; and the number of information symbols is 28; the number of parity symbols is 4, the erasure correction and the hard decision decoding described in the literature 1 are effected according to the second embodiment of this invention. Effects of this invention can be verified in FIG. 9, in which for a case where the symbol error rate before the error correction is e.g. $1\times10^{-2}$, the erasure correction according to the second embodiment ameliorates the decoding error rate by more than one order of magnitude with respect to the hard decision decoding.

As explained above, according to this invention, it is possible to generate the reliability for every symbol consisting of n binary signals from received or reproduced digital signals, which enables high degree information processing such as the soft decision decoding for nonbinary error correcting codes, and which corrects errors for every symbol.

We claim:

1. A device for decoding coded digital signals for every symbol consisting of a plurality of binary signals comprising:

first means for generating a respective first reliability for every binary signal; hard decided from the received or reproduced signal, in said symbol;

second means for generating a second reliability for each symbol on the basis of said first reliabilities of all bits composing the symbols; and means for performing soft decision decoding for every symbol on the basis of said second reliability.

2. A device for decoding coded digital signals according to claim 1, wherein said first means consists of means for quantizing each of received or reproduced signal into bits not less than 2, means for adopting the most significant bit as binary signal the result of a hard decision; and means for adopting the bits other than the most significant bit as the reliabilities of the binary signal.

3. A device for decoding coded digital signals according to claim 1, wherein said second means obtains said second reliability $L_i$ by using;

$$L_i \simeq -\log\{\exp(-r_{i1})+\exp(-r_{i2}) + \ldots + \exp(-r_{in})\},$$

where $r_{ij}(1 \leq j \leq n)$ is a likelihood ratio of the j-th binary signal of the i-th symbol consisting of n binary signals.

4. A device for decoding coded digital signals according to claim 1, wherein said second means obtains said second reliability $L_i$ by using;

$$L_i \simeq \min(r_1, r_2, \ldots, r_n)$$

where $r_{ij}(1 \leq j \leq n)$ is a likelihood ratio of the j-th binary signal of the i-th symbol consisting of n binary signal.

5. A device for decoding coded digital signals according to claim 1, wherein said second reliability is the lowest one among the first reliabilities of the binary signals.

6. A device for decoding coded digital signals according to claim 1, wherein said second reliability is the product of the first reliabilities of the binary signals.

7. A device for decoding coded digital signals according to claim 1, wherein said second reliability is the sum of the first reliabilities of the binary signals.

* * * * *